United States Patent
Terashima

(10) Patent No.: US 7,855,427 B2
(45) Date of Patent: Dec. 21, 2010

(54) SEMICONDUCTOR DEVICE WITH A PLURALITY OF ISOLATED CONDUCTIVE FILMS

(75) Inventor: Tomohide Terashima, Tokyo (JP)

(73) Assignee: Mitsubushi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/177,707

(22) Filed: Jul. 22, 2008

(65) Prior Publication Data

US 2008/0290443 A1    Nov. 27, 2008

Related U.S. Application Data

(62) Division of application No. 11/134,352, filed on May 23, 2005, now abandoned, which is a division of application No. 10/655,037, filed on Sep. 5, 2003, now Pat. No. 6,921,945.

(30) Foreign Application Priority Data

May 12, 2003    (JP)    ............... 2003-132756

(51) Int. Cl.
    H01L 29/02    (2006.01)
(52) U.S. Cl. ...................... 257/487; 257/349
(58) Field of Classification Search ............... 257/168, 257/347, 409, 487, 478
    See application file for complete search history.

(56) References Cited

U.S. PATENT DOCUMENTS

| 4,134,123 A | 1/1979 | Shannon |
| 5,343,067 A | 8/1994 | Nakagawa et al. |
| 5,485,030 A | 1/1996 | Terashima |
| 5,561,077 A | 10/1996 | Terashima |
| 6,049,109 A | 4/2000 | Omura et al. |

(Continued)

FOREIGN PATENT DOCUMENTS

DE    195 33 956    3/1996

(Continued)

OTHER PUBLICATIONS

Hideyuki Funaki, et al., "New 1200V MOSFET Structure on SOI with SIPOS Shielding Layer", Proceedings of 1998 International Symposium on Power Semiconductor Devices & ICs, pp. 25-28.

*Primary Examiner*—Bradley K Smith
(74) *Attorney, Agent, or Firm*—Oblon, Spivak, McClelland, Maier & Neustadt, L.L.P.

(57) ABSTRACT

A semiconductor layer provided on a BOX (buried oxide) layer includes a first P-type region, an $N^+$-type region, and an $N^-$-type region which together form a diode. A plurality of second P-type regions are provided on a bottom part of the semiconductor layer. A plurality of insulating oxide films are interposed between the plurality of second P-type regions. When the diode is in a reverse-biased state, the second P-type region directly below the $N^+$-type region is approximately the same in potential as the $N^+$-type region. The second P-type region will be lower in potential relative to this second P-type region directly below the $N^+$-type region, as the second P-type region gets nearer to the first P-type region. Electric field concentration can thus be relaxed at an interface between the semiconductor layer and the BOX layer, whereby improvement in breakdown voltage of the diode is realized.

1 Claim, 13 Drawing Sheets

U.S. PATENT DOCUMENTS

| | | |
|---|---|---|
| 6,091,108 A | 7/2000 | Harris et al. |
| 6,410,950 B1 | 6/2002 | Sittig et al. |
| 6,465,863 B1 | 10/2002 | Deboy et al. |
| 6,469,359 B2 | 10/2002 | Bakowski et al. |
| 6,909,149 B2 | 6/2005 | Russ et al. |

FOREIGN PATENT DOCUMENTS

| | | |
|---|---|---|
| JP | 8-88377 | 4/1996 |
| JP | 9-97886 | 4/1997 |
| JP | 2000-22140 | 1/2000 |
| WO | WO 01/59846 A1 * | 8/2001 |

* cited by examiner

F I G. 7
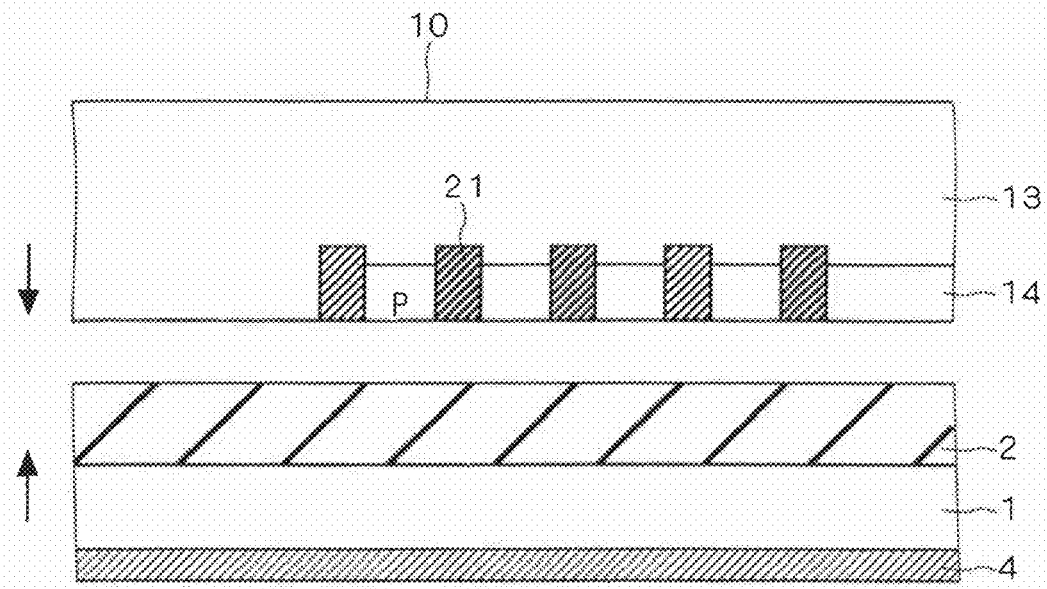
F I G. 8
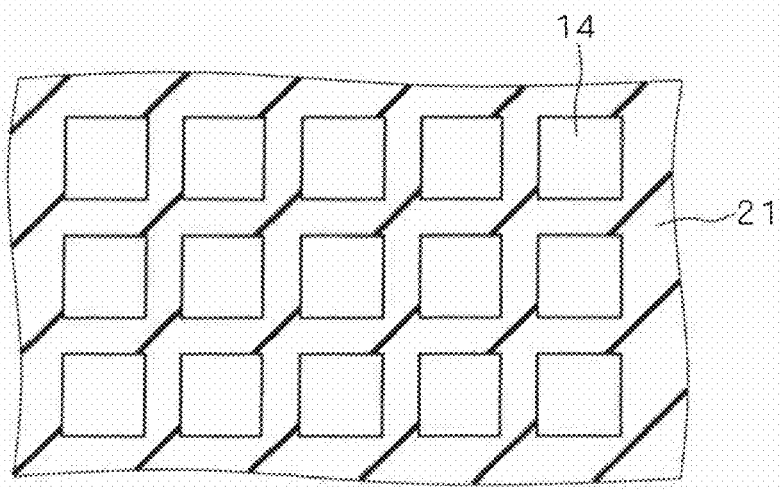

F I G. 1 3 A
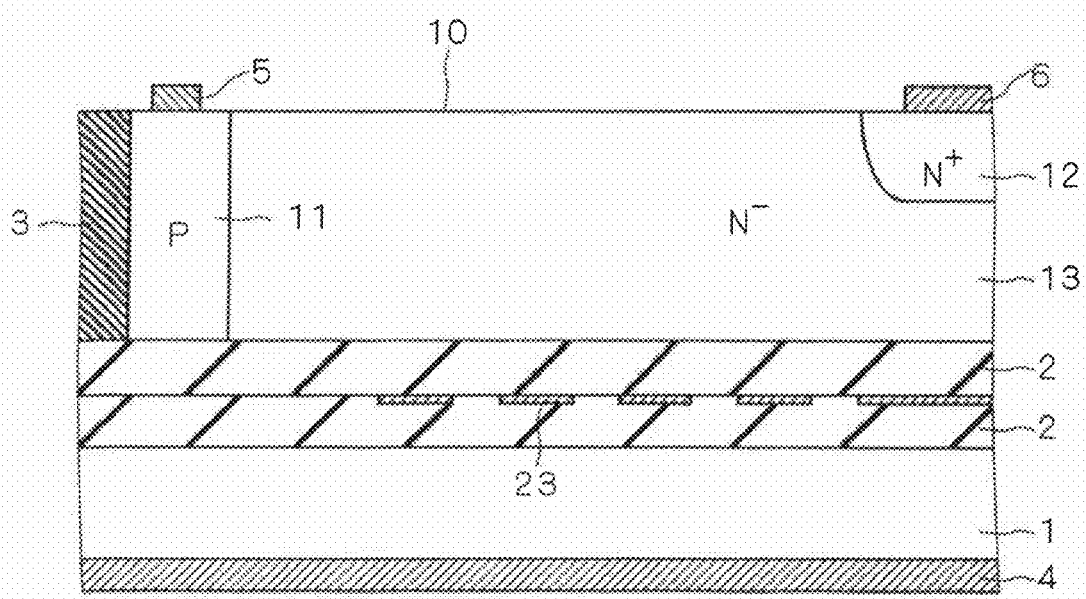
F I G. 1 3 B
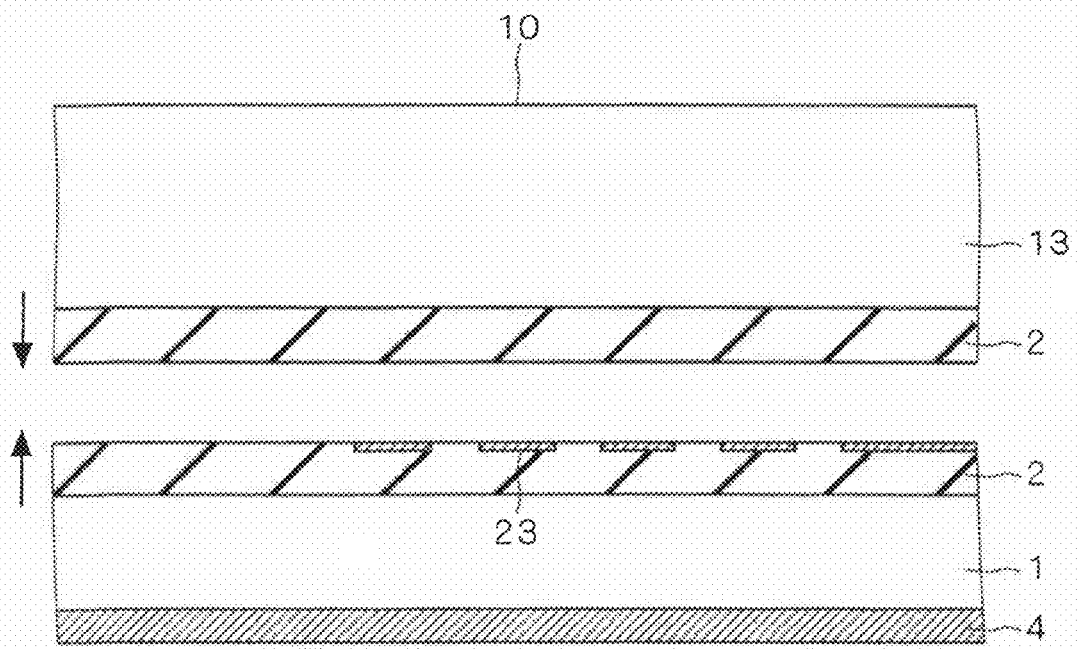

F I G . 1 6
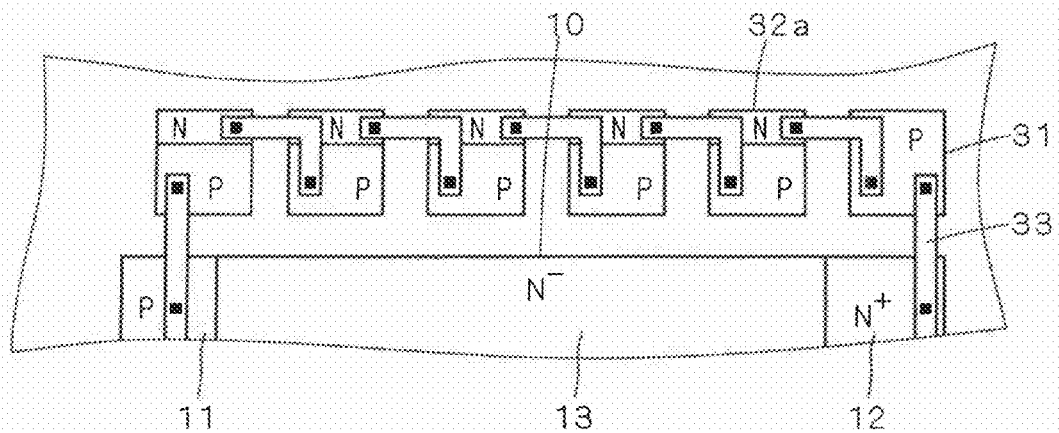
F I G . 1 7
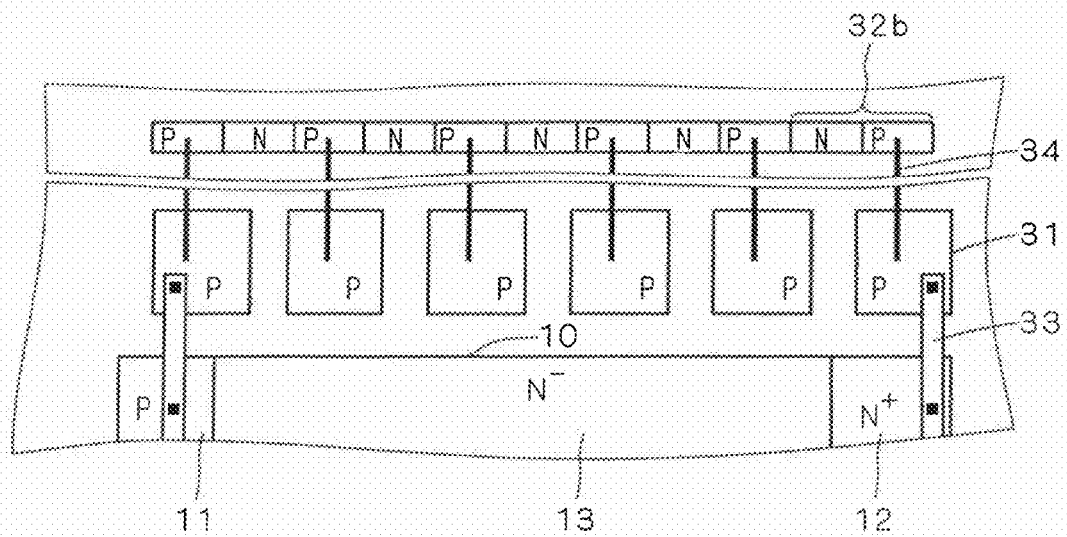

F I G . 2 0
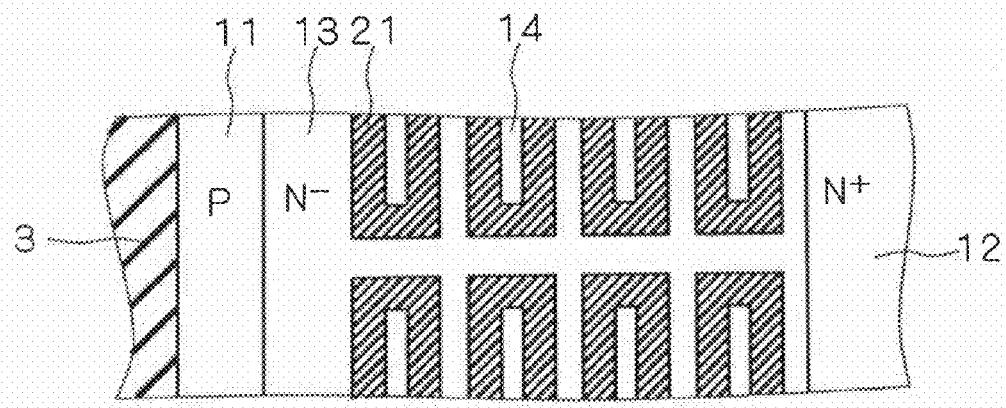
F I G . 2 1
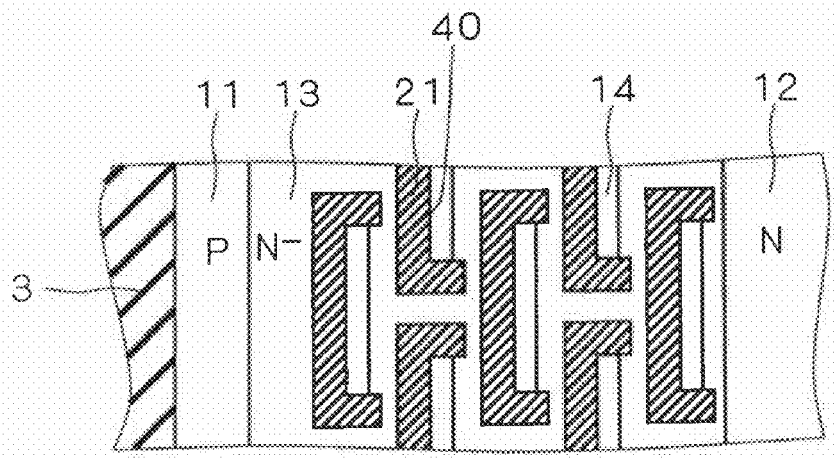

F I G . 2 4
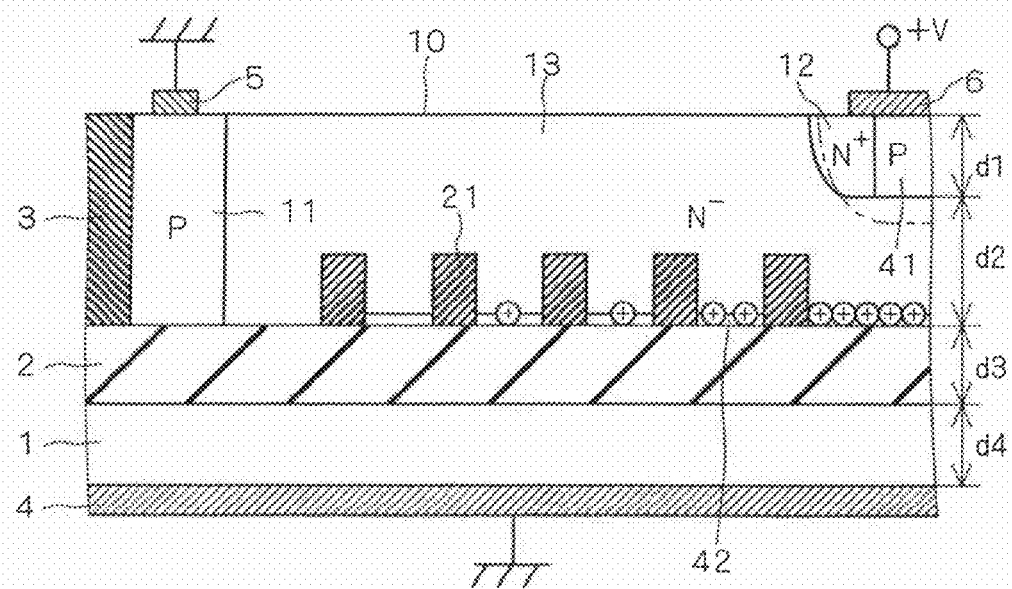
F I G . 2 5
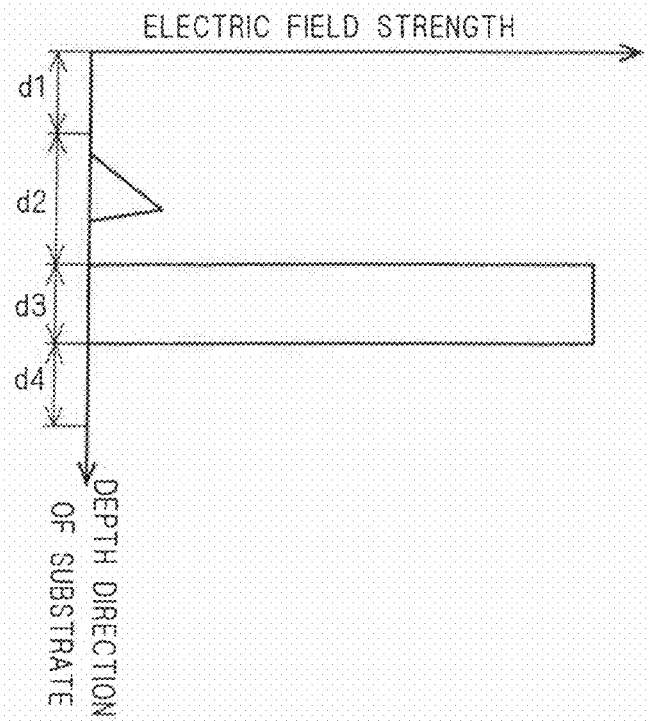

SEMICONDUCTOR DEVICE WITH A PLURALITY OF ISOLATED CONDUCTIVE FILMS

CROSS-REFERENCE TO RELATED APPLICATIONS

This application is a Divisional of patent application Ser. No. 11/134,352, filed May 23, 2005, which is a divisional of patent application Ser. No. 10/655,037, filed Sep. 5, 2003, now U.S. Pat. No. 6,921,945, issued Jul. 26, 2005, and claims priority to Japanese Patent Application No. 2003-132756, filed in the Japanese Patent Office on May 12, 2003. The entire contents of these applications are hereby incorporated by reference.

BACKGROUND OF THE INVENTION

1. Field of the Invention

The present invention relates to a semiconductor device with an SOI (semiconductor-on-insulator) structure.

2. Description of the Background Art

A well-known semiconductor device with an SOI structure comprises a BOX (buried oxide) layer provided on a silicon substrate, and a semiconductor layer provided on the BOX layer. As an example of a diode which is formed in the semiconductor layer on the BOX layer, a PiN diode structure is generally known which includes a P-type region as an anode, an $N^+$-type region as a cathode, and an $N^-$-type region between the P-type region and the $N^+$-type region. An exemplary structure of which is introduced in Japanese Patent Application Laid-Open No. 6-188438 (1994) or U.S. Pat. No. 5,485,030. As a precondition for improving a breakdown voltage of a diode having such a structure, even when the $N^-$-type region is in a completely depleted state, avalanche breakdown should be prevented in an area of an element having a maximum electric field.

When such a diode is brought to a state in which the P-type region (anode) and the silicon substrate are at 0 V, and a positive voltage is applied to the $N^+$-type region (cathode) (which state will be referred to as a "reverse-biased state"), a depletion layer at pn junction between the P-type region and the $N^-$-type region is caused to extend, entering into the $N^-$-type region. Supposing that the anode and the cathode are spaced with a sufficient distance therebetween, the silicon substrate under the BOX layer is operative to serve as a field plate, thereby causing a depletion layer at a boundary between the $N^-$-type region and the BOX layer to extend, further entering into the $N^-$-type region. The extension of the latter depletion layer facilitates the extension of the former depletion layer. As a result, an electric field is relaxed at the pn junction between the $N^-$-type region and the P-type region, which effect is generally called as RESURF (reduced surface field) effect. The conditions for the depletion layer to extend from the boundary between the $N^-$-type region and the BOX layer into the $N^-$-type region are called as RESURF conditions.

When the RESURF conditions are satisfied, localized concentration of an electric field is relaxed in an active layer, whereby the electric field exhibits a distribution suitable for improving a breakdown voltage. In this case, the diode bears a breakdown voltage which depends on avalanche breakdown occurring at an interface between the $N^-$-type region and the BOX layer, in an area directly below the $N^+$-type region. That is, the breakdown voltage of the diode is determined by the sum of voltage drops caused by the electric field in the $N^-$-type region and the BOX layer, in the region directly below the $N^+$-type region. Especially, the BOX layer experiences an extremely large voltage drop, significantly exerting an influence on the breakdown voltage of the diode as a whole. In response, as a way to obtain a high breakdown voltage of a semiconductor device as disclosed in Japanese Patent Application Laid-Open No. 6-188438 (1994) or U.S. Pat. No. 5,485,030, the present inventor has suggested increase in thickness of the BOX film, or provision of a region in the BOX layer having a low dielectric constant such as a vacuum layer.

Increase in thickness of the BOX layer may be the most realistic way to provide a high breakdown voltage of a semiconductor device. On the other hand, it will be harder to obtain RESURF effect as the BOX layer increases in thickness, causing difficulty in bringing a bottom part of the $N^-$-type region on the side of the anode to a depleted state. In order to obtain a high breakdown voltage of 1000 V or more, the BOX layer should be 6 μm or more in thickness. In terms of manufacturing process and manufacturing efficiency, however, the maximum possible thickness of the BOX layer is around 4 μm.

As another way to improve a breakdown voltage of a semiconductor element, provision of surface asperities to the BOX layer, or provision of a floating electrode within the BOX layer, has been suggested. An exemplary technique of which is introduced in Japanese Patent Application Laid-Open No. 8-88377(1996).

As still another way to improve a breakdown voltage of a semiconductor device, an SIPOS (semi-insulating polysilicon) layer may be provided to the bottom part of the $N^-$-type region, an exemplary technique of which is introduced in "New 1200 V MOSFET Structure on SOI with SIPOS Shielding Layer", Proceedings of 1998 International Symposium on Power Semiconductor Devices & ICs, pp. 25-28. The SIPOS layer has a high resistance capable of controlling a mobility of electric charges therein to a minimum possible degree. The SIPOS layer is charged according to the electric field applied thereto, is operative to shield the electric field. Further, the SIPOS layer has such a distribution of electric charges that the strength of the electric field applied thereto is weakened. Due to the low mobility of electric charges, electric charges induced into the SIPOS layer are hard to provide such an energy level that an avalanche phenomenon occurs.

In a diode including the SIPOS layer, electric field concentration in the $N^-$-type region is relaxed, eventually producing an approximately uniform electric field distribution that is similar to the distribution obtained by a one-dimensional PiN diode. At this time, in the area directly below the N+-type region, electric field is generated mostly in the BOX layer. That is, in the area directly below the $N^+$-type region, voltage drop occurs mostly in the BOX layer. As a result, the diode including the SIPOS layer is theoretically allowed to have a breakdown voltage of up to the breakdown voltage of the BOX layer.

As discussed, increase in thickness of the BOX may be the most realistic way for improving a breakdown voltage of a semiconductor device with an SOI structure, on which constraints are imposed by manufacturing process and manufacturing efficiency.

As discussed, surface asperities may be provided to the BOX layer as taught by Japanese Patent Application Laid-Open No. 8-88377 (1996). When a diode provided on this BOX layer is brought to a reverse-biased state, an inversion layer is formed at recesses of the surface asperities of the BOX layer for weakening the electric field strength of the semiconductor element. This develops a strong electric field around the bottom surface of a semiconductor layer including the diode formed therein, possibly producing a transient avalanche phenomenon at the interface between the semiconductor layer and the BOX layer thereunder. Such a phenomenon leads to an initial leakage current or variation in breakdown voltage. For this reason, the semiconductor element provided with surface asperities on the BOX layer is unsuitable for maintaining a dynamic voltage level. The BOX layer may alternatively be provided with a floating electrode, in which case this floating electrode should be charged by applying a high voltage to the semiconductor device in advance to produce an avalanche phenomenon.

Still as discussed, provision of an SIPOS film over the BOX layer also leads to improvement in breakdown voltage of a semiconductor device. In contrast to a single crystal, however, carriers of the SIPOS film are generally at an intermediate energy level, which fact causes carrier excitation. As a semiconductor element rises in temperature, the SIPOS film decreases in resistivity, leading to a heavy loss of energy caused by a leakage current. This means that a tolerance to high temperature, as one of the great advantages of an SOI structure, suffers restraints. In addition, the SIPOS film provides a low carrier mobility, disadvantageously affecting transient response characteristic. That is, speed of polarization cannot be responsive to voltage application.

SUMMARY OF THE INVENTION

In a semiconductor device with an SOI structure, it is an object of the present invention to improve a breakdown voltage without causing the problem resulting from a leakage current or degradation of a transient response characteristic.

The present invention is intended for a semiconductor device including a semiconductor substrate, a first insulating film provided on the semiconductor substrate, and a first semiconductor layer provided on the first insulating film. The first semiconductor layer includes a first region of a first conductivity type, a second region of a second conductivity type having a relatively low resistance, and a third region of the second conductivity type having a relatively high resistance. The third region is defined between the first region and the second region.

According to a first aspect of the present invention, the semiconductor device includes a plurality of fourth regions of the first conductivity type, and a second insulating film provided between the plurality of fourth regions. The plurality of fourth regions are provided on a bottom part of the first semiconductor layer. The second insulating film stands upright on the first insulating film.

According to a second aspect of the present invention, the semiconductor device includes a plurality of conductive films provided at least on one side of the first insulating film, and a third insulating film. The third insulating film isolates the plurality of conductive films from each other, and isolates the plurality of conductive films from the semiconductor substrate and/or from the first semiconductor layer.

According to a third aspect of the present invention, the semiconductor device includes a plurality of conductive films provided in the first insulating film. The plurality of conductive films are isolated from each other. A predetermined voltage can be applied from outside to each one of the plurality of conductive films.

According to a fourth aspect of the present invention, the semiconductor device includes a fourth insulating film provided on a side surface of the first semiconductor layer, and a voltage dividing element provided along the first semiconductor layer while holding the fourth insulating film therebetween. The voltage dividing element divides a voltage across the fist region and the second region in a multistep process.

According to a fifth aspect of the present invention, the semiconductor device includes a plurality of fifth regions of the first conductivity type provided in the first semiconductor layer with a certain distance therebetween, and a plurality of fifth insulating films standing upright on the first insulating film with a certain distance therebetween. The plurality of fifth regions reach a bottom surface of the first semiconductor layer. The plurality of fifth insulating films are provided to respective ones of the plurality of fifth regions, at least closer to the first region than the plurality of fifth regions.

According to a sixth aspect of the present invention, the semiconductor device includes a sixth insulating film provided on a bottom part of the first semiconductor layer, an electrode connected to the second region, and a sixth region provided in the first semiconductor layer to be connected to the electrode. The sixth insulating film stands upright on the first insulating film.

Electric field concentration can be relaxed at a boundary between the first semiconductor layer and the first insulating film, and more specifically, at a boundary therebetween in a downward direction with respect to the second region. As a result, the breakdown voltage of the semiconductor device can be improved. Further, the mechanism for improving a breakdown voltage does not cause an avalanche phenomenon. This means there will be no initial leakage current or variation in breakdown voltage involved with application of a voltage, whereby the semiconductor device of the present invention can suitably be applied for maintaining a dynamic voltage level. Still further, there will be no degradation of a transient response characteristic to voltage application.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 through 7 illustrate steps of manufacturing a semiconductor device according to the first preferred embodiment of the present invention;

FIG. 8 illustrates a modification of the first preferred embodiment of the present invention;

FIGS. 12, 13A and 13B each illustrate a modification of the second preferred embodiment of the present invention;

FIGS. 16 through 18 each illustrate a modification of the third preferred embodiment of the present invention;

FIGS. 20 and 21 each illustrate a modification of the fourth preferred embodiment of the present invention;

FIG. 24 illustrates a configuration of a semiconductor device according to a sixth preferred embodiment of the present invention; and FIG. 25 shows an electric field distribution in a directly downward direction with respect to a cathode of the semiconductor device according to the sixth preferred embodiment of the present invention.

DESCRIPTION OF THE PREFERRED EMBODIMENTS

In the preferred embodiments to be described below, a PiN diode is described as a semiconductor element to which the present invention is applied. However, the applicability of the present invention is not limited to a PiN diode. The present invention can be widely applied to other types of semiconductor elements including the equivalent structure such as an MOSFET, an IGBT, a bipolar transistor, and the like.

First Preferred Embodiment

Figure 1:
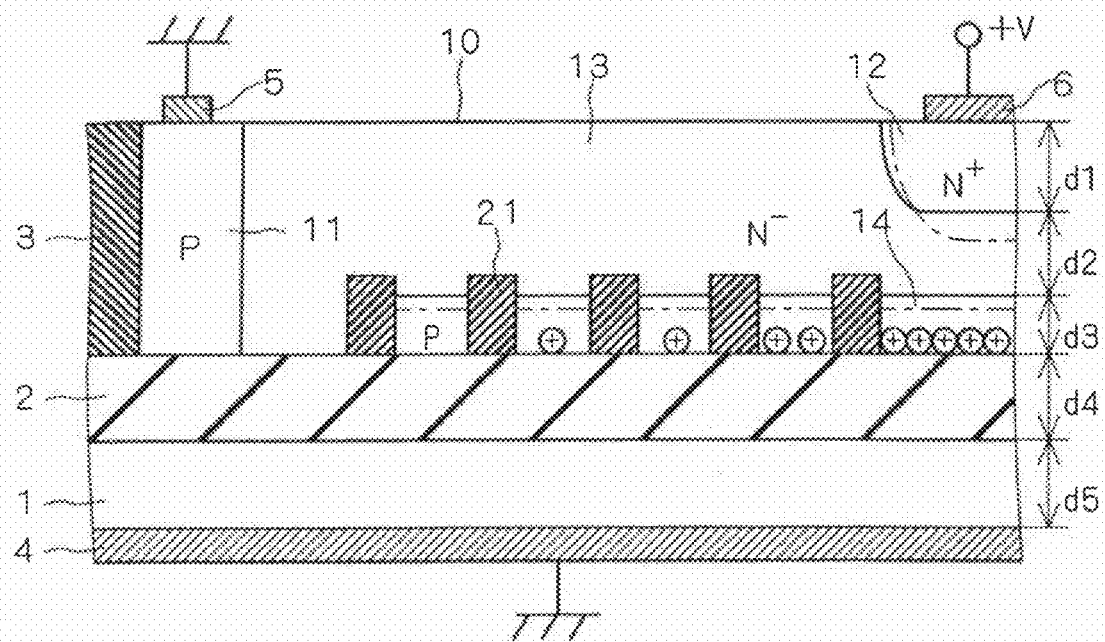
FIGS. 1 and 2 illustrates a configuration of a semiconductor device according to a first preferred embodiment of the present invention.
Figure 2:
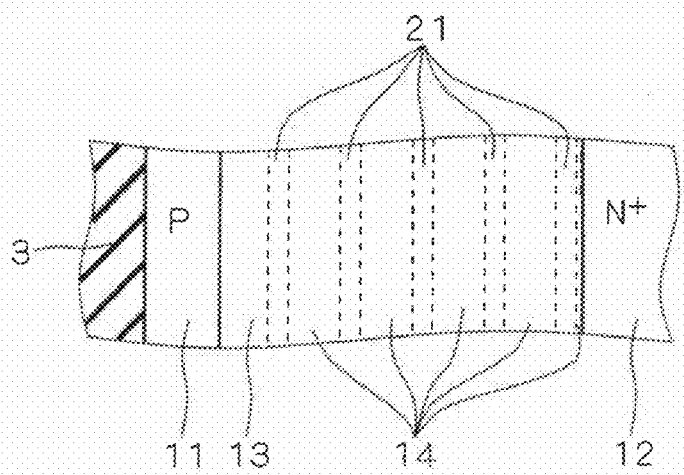

FIGS. 1 and 2 are a sectional view and a top view, respectively, for illustrating a configuration of a semiconductor device according to a first preferred embodiment of the present invention. In the top view, an anode electrode 5 and a cathode electrode 6 are omitted for simplification. As shown in FIGS. 1 and 2, the semiconductor device has an SOI structure comprising a silicon substrate 1, a BOX (buried oxide) layer 2 as a first insulating film, and a semiconductor layer 10 (first semiconductor layer). The semiconductor layer 10 includes a first P-type region 11 as a first region of a P type (first conductivity type), an $N^+$-type region 12 as a second region of an N type (second conductivity type) having a relatively low resistance, and an $N^-$-type region 13 as a third region of the N type having a relatively high resistance. The $N^-$-type region 13 is defined between the P-type region 11 and the $N^+$-type region 12. That is, the semiconductor layer 10 constitutes a PiN diode including the first P-type region 11 as an anode, and the $N^+$-type region 12 as a cathode. An isolation oxide film 3 is provided around the PiN diode, to isolate the PiN diode from other elements. A rear electrode 4 is provided on a back surface of the silicon substrate 1. Further, the anode electrode 5 and the cathode electrode 6 are provided on the first P-type region 11 and on the $N^+$-type region 12, respectively.

The semiconductor device of the first preferred embodiment is provided with a plurality of second P-type regions 14 as fourth regions of the P type at the bottom part of the semiconductor layer 10. The second P-type regions 14 are arranged in a space including the area directly below the $N^+$-type region 12. A plurality of insulating oxide films 21 as second insulating films are provided between the second P-type regions 14, standing upright on the BOX layer 2. With reference to FIG. 2, the insulating oxide films 21 are interposed between the plurality of second P-type regions 14, in the space defined the first P-type region 11 and the $N^+$-type region 12. In FIGS. 1 and 2, the part including the second P-type regions 14 and the insulating oxide films 21 is shown to cover only a part of the bottom surface of the semiconductor layer 10. Such a part may alternatively cover the entirety of the bottom surface of the semiconductor layer 10.

The second P-type regions 14 are held in a floating state. When the diode is brought to a reverse-biased state in which the anode (first P-type region 11) and the silicon substrate 1 are at 0V, and a positive voltage is applied to the cathode ($N^+$-type region 12), the potential of the second P-type region 14 will be higher as the second P-type region 14 gets nearer to the $N^+$-type region 12. That is, the second P-type region 14 directly below the $N^+$-type region 12 is approximately the same in potential as the $N^+$-type region 12. The potential of the second P-type region 14 will be lower relative to this second P-type region 14 directly below the $N^+$-type region 12, as the second P-type region 14 gets nearer to the first P-type region 11.

Figure 3:
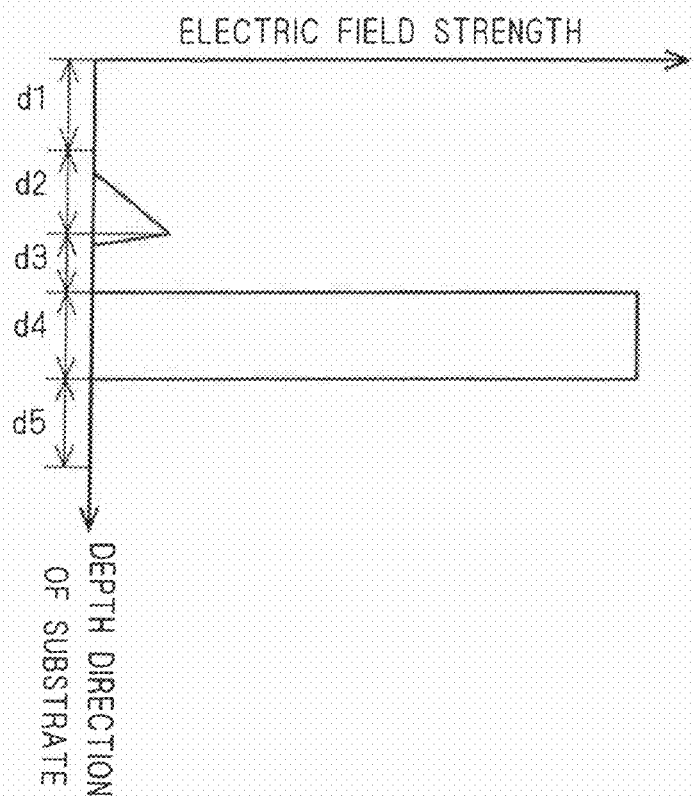
FIG. 3 shows an electric field distribution in a directly downward direction with respect to a cathode of the semiconductor device according to the first preferred embodiment of the present invention.

FIG. 3 shows an electric field distribution at this stage in a directly downward direction with respect to the $N^+$-type region 12. Reference characters d1 through d5 of FIG. 3 correspond to those indicated in FIG. 1. As seen from FIG. 3, in the space between the $N^+$-type region 12 and the silicon substrate 1, an electric field is generated mostly in the BOX layer 2. This means the semiconductor device is theoretically allowed to have a breakdown voltage of up to the breakdown voltage of the BOX layer 2, whereby a diode structure having a breakdown voltage of 1000 V or more can be realized. The second P-type regions 14 are positively-charged state when in a reverse-biased state. Due to the existence of the BOX layer 2 and the insulating oxide films 21 on the side of electric filed directions of the second P-type regions 14 (on the side of the silicon substrate 1 and the first P-type region 11, respectively), electric charges cannot move from the second P-type regions 14. As a result, no avalanche breakdown occurs.

Assuming that the second P-type regions 14 are omitted from FIG. 1, in which case a strong electric field is developed around the bottom surface of the semiconductor layer 10, an avalanche phenomenon is produced at the interface between the $N^-$-type region 13 and the BOX layer 2. Carriers of a hole current resulting from this avalanche phenomenon accumulate on the bottom surface of the $N^-$-type region 13, thereby forming a P-type inversion layer that is operative in the same manner as the second P-type regions 14. Even in the absence of the second P-type regions 14, this inversion layer seemingly leads to improvement in breakdown voltage. However, this inversion layer cannot suitably be applied for maintaining a dynamic voltage level, as an initial leakage current or variation in breakdown voltage is caused by the avalanche phenomenon. In contrast, in the first preferred embodiment, the existence of the second P-type regions 14 previously provided on the bottom surface of the $N^-$-type region 13 avoids such problems.

Similar to the semiconductor device as discussed in the description of the background art, the semiconductor device of the first preferred embodiment is formed only by single-crystalline silicon and oxide films thereof. The semiconductor device of the first preferred embodiment thus bears the similar characteristics (including a temperature characteristic of a leakage current and a transient response characteristic) to those of the background-art semiconductor device, which device has the configuration obtained by omitting the second P-type regions 14 and the insulating oxide films 21 from the configuration shown in FIG. 1. That is, the first preferred embodiment does not cause degradation of a transient response characteristic as a result of provision of an SIPOS film on a BOX layer with the intention of improving a breakdown voltage.

Figure 4:
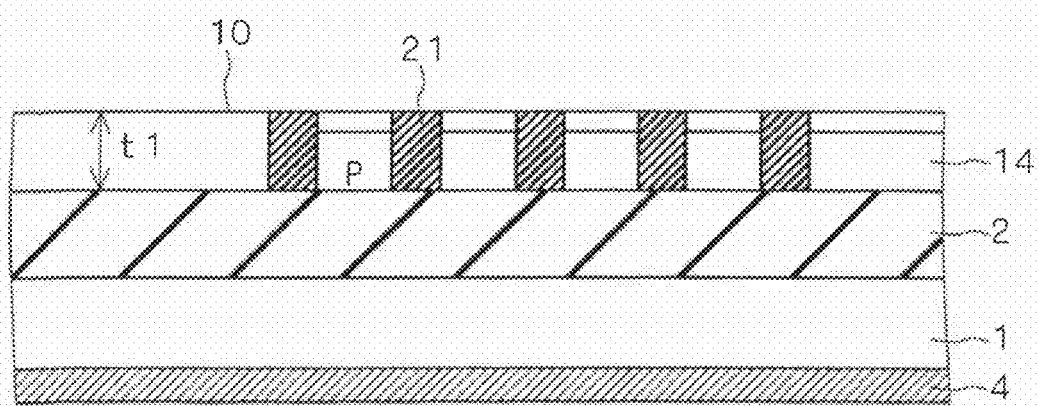
Figure 5:
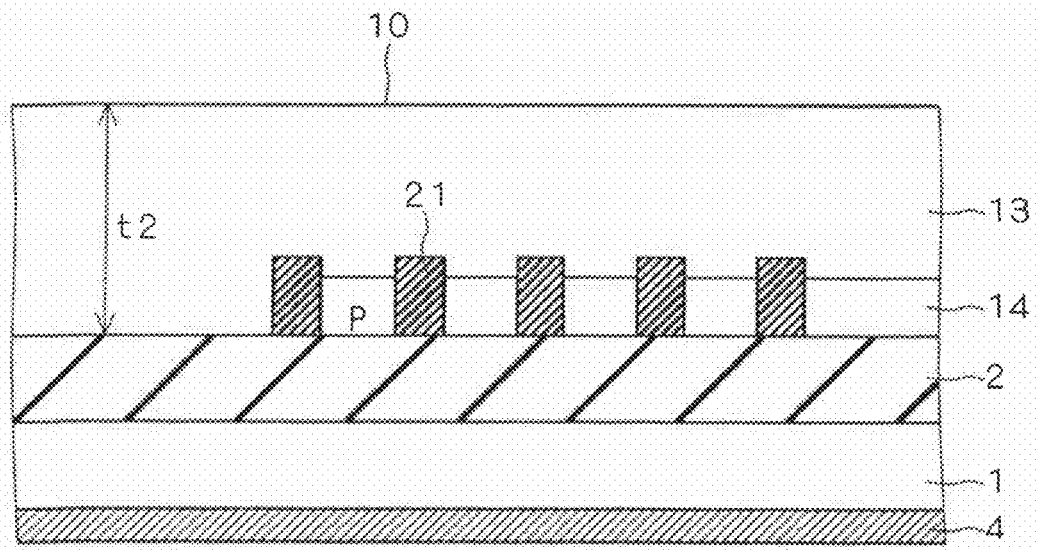
Figure 6:
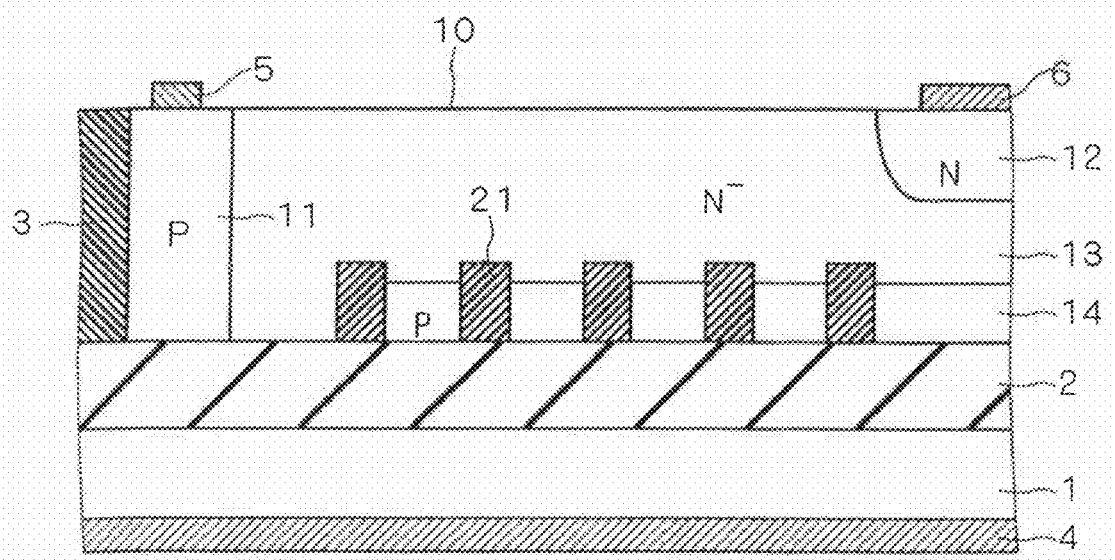

Next, the method of forming the semiconductor device of the first preferred embodiment will be described. In a first way, the semiconductor layer 10 is formed in two stages. With reference to FIG. 4, the first stage includes deposition of the semiconductor layer 10 to a thickness of t1, trench etching and oxide deposition to form the insulating oxide films 21, and ion implantation to form the second P-type regions 14. The second stage includes growth of the semiconductor layer 10 to a thickness of t2 (FIG. 5), trench etching and oxide deposition to form the isolation oxide film 3, and ion implantation to form the first P-type region 11, the $N^+$-type region 12, and the $N^-$-type region 13 (FIG. 6).

In a second way, the semiconductor layer 10 is provided in advance with the second P-type regions 14 and the insulating oxide films 21, which is then bonded to the BOX layer 2 as shown in FIG. 7. After bonding, formation of the isolation oxide film 3, the first P-type region 11, the $N^+$-type region 12, and the $N^-$-type region 13 also follow as described in the first way with reference to FIG. 6.

In the first preferred embodiment, with reference to FIG. 2, a plurality of stripes arranged in juxtaposition form the second P-type regions 14. The second P-type regions 14 may have an alternative pattern. By way of example, the second P-type regions 14 may include a plurality of blocks, which pattern produces the same effect as obtained by the pattern with a plurality of stripes. When these blocks of the pattern are uniformly arranged on the bottom part of the semiconductor layer 10, the pattern design of the second P-type regions 14 can be easier than the design of the pattern with stripes which requires consideration for orientation of each stripe. Further, when the blocks are entirely provided on the bottom part of the semiconductor layer 10, no mask alignment is required with the pattern of the insulating oxide films 21 in the formation of the second P-type regions 14, resulting in simplification of manufacturing process.

Second Preferred Embodiment

Figure 9:
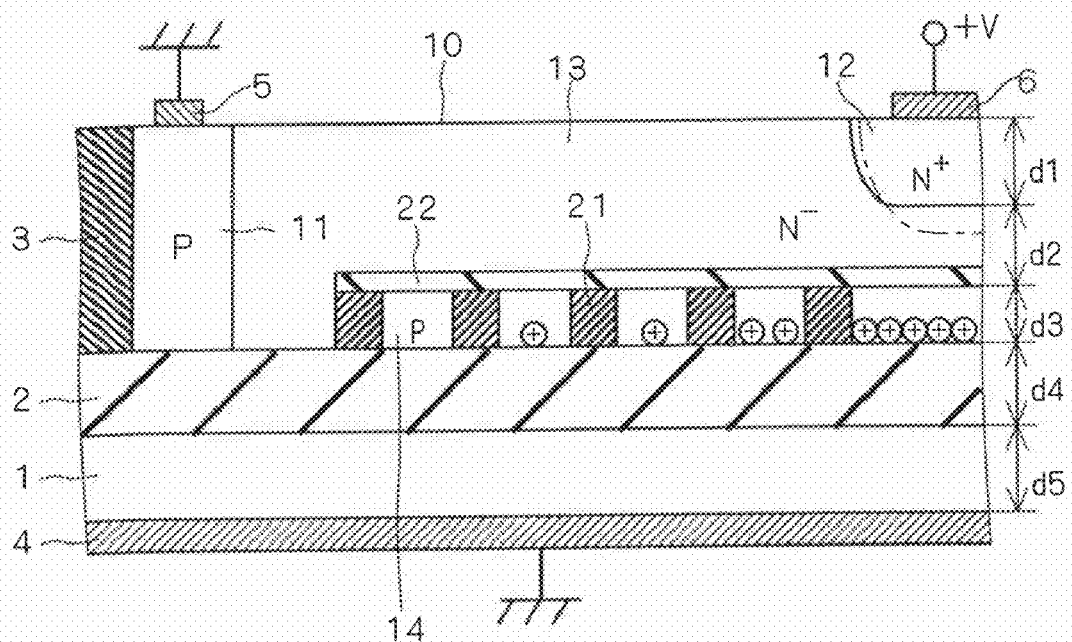
FIG. 9 illustrates a configuration of a semiconductor device according to a second preferred embodiment of the present invention.

FIG. 9 illustrates a configuration of a semiconductor device according to a second preferred embodiment of the present invention. In FIG. 9, the same constituent elements as those shown in FIG. 1 are designated by the same reference numerals, and the detailed description thereof is omitted here. With reference to FIG. 9, the semiconductor device of the second preferred embodiment includes an insulating oxide film 22 provided on the second P-type regions 14 of the semiconductor device as described in the first preferred embodiment. The insulating oxide film 22 is operative to isolate the second P-type regions 14 from the PiN diode including the first P-type region 11, the $N^+$-type region 12, and the $N^-$-type region 13.

In other words, in the semiconductor device of the second preferred embodiment, a second semiconductor layer including the second P-type regions 14 is provided as a conductive film on the side of the upper surface of the BOX layer 2. The insulating oxide films 21 are interposed between the plurality of second P-type regions 14, while isolating the second P-type regions 14 from each other. The insulating oxide film 22 is operative to isolate the second P-type regions 14 from the first semiconductor layer. That is, the insulating oxide films 21 and 22 are operative to serve as third insulating films.

Although not indicated, a predetermined voltage can be applied from outside to each one of the plurality of second P-type regions 14.

The application of a voltage from outside to the second P-type regions 14 is performed in such a manner that, in a reverse-biased state, the second P-type region 14 directly below the $N^+$-type region 12 will be approximately the same in potential as the $N^+$-type region 12, and that the potential of the second P-type region 14 will be lower relative to this second P-type region 14 directly below the $N^+$-type region 12 as the second P-type region 14 gets nearer to the first P-type region 11. That is, the second preferred embodiment provides a voltage distribution in the second P-type regions 14 similar to the one obtained in the first preferred embodiment.

Figure 10:
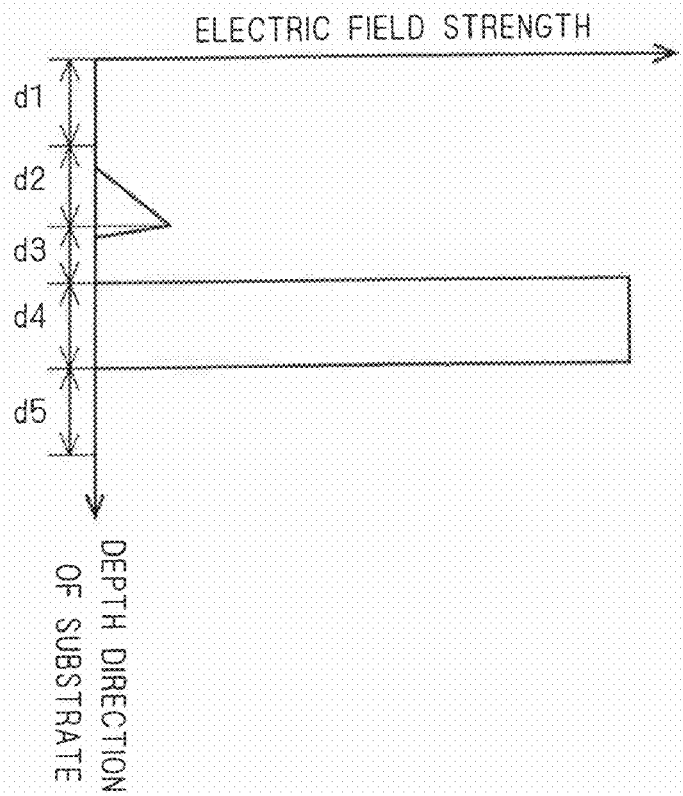
FIG. 10 shows an electric field distribution in a directly downward direction with respect to a cathode of the semiconductor device according to the second preferred embodiment of the present invention.

FIG. 10 shows an electric field distribution at this stage in a directly downward direction with respect to the $N^+$-type region 12. Similar to the first preferred embodiment, in the space between the $N^+$-type region 12 and the silicon substrate 1, an electric field is generated mostly in the BOX layer 2. This allows improvement in breakdown voltage of a semiconductor device. The second preferred embodiment also avoids increase in leakage current and degradation of a transient response characteristic as discussed in the first preferred embodiment.

Figure 11:
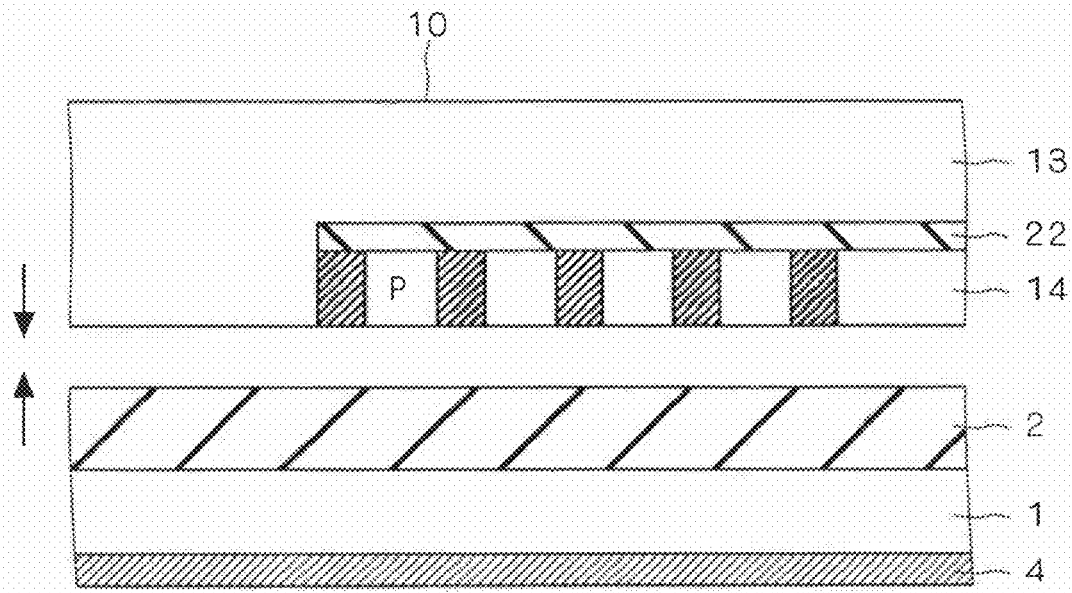
FIG. 11 illustrates a step of manufacturing a semiconductor device according to the second preferred embodiment of the present invention.

Next, the method of forming the semiconductor device of the second preferred embodiment will be described. The first and second ways as discussed in the first preferred embodiment can also be applied in the second preferred embodiment. In the first way, the semiconductor layer 10 is formed in two stages. In the second way, the semiconductor layer 10 is provided in advance, which is then bonded to the BOX layer 2. When the second way is employed, the semiconductor layer 10 is provided with the second P-type regions 14, and the insulating oxide films 21 and 22 in advance, which is then bonded to the BOX layer 2 as shown in FIG. 11.

Figure 12:
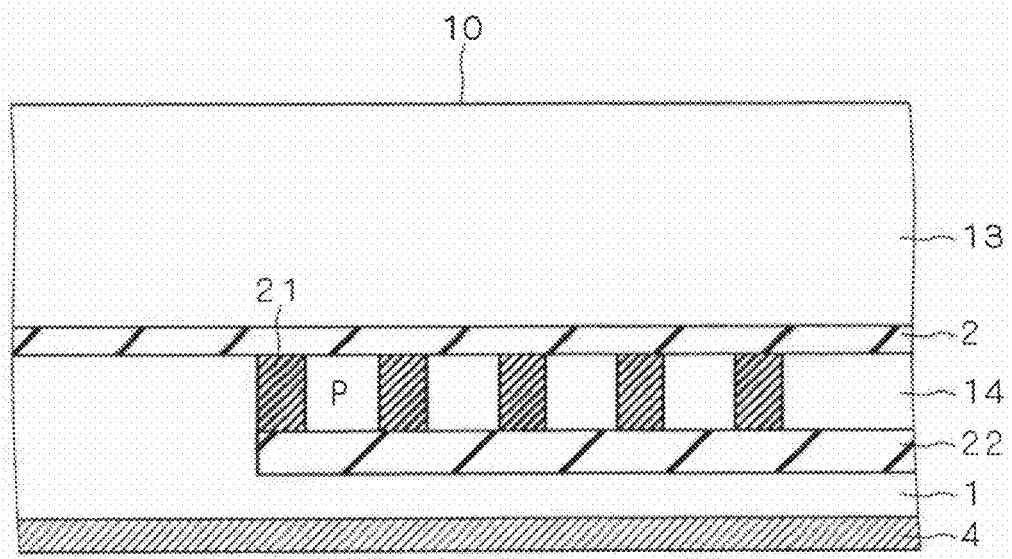

FIG. 12 illustrates a modification of the second way. The second P-type regions 14, and the insulating oxide films 21 and 22 may be provided to the silicon substrate 1, not to the semiconductor layer 10. The semiconductor layer 10 is thereafter bonded to the BOX layer 2. In this modification, in a directly downward direction with respect to the $N^+$-type region 12, the electric field is generated mostly in the insulating oxide film 22 provided under the second P-type regions 14. This means the semiconductor device of FIG. 12 is theoretically allowed to have a breakdown voltage of up to the breakdown voltage of the insulating oxide film 22. The insulating oxide film 22 of FIG. 12 is thus desirably greater in thickness than in FIG. 11.

In the second preferred embodiment, the second P-type regions 14 may be replaced by other substances, as long as they have a conductivity. By way of example, the second P-type regions 14 may be replaced by an N-type region or polysilicon.

When polysilicon is used as a conductive film, polysilicon films 23 may be buried in the BOX layer 2 as shown in FIG. 13A. In this case, with reference to FIG. 13B, the BOX layer 2 is provided both to the silicon substrate 1 and to the semiconductor layer 10. Thereafter, recesses are formed in the BOX layer 2 on one side (in the example of FIG. 13B, on the side of the silicon substrate 1), followed by deposition of polysilicon thereon and etch back, whereby these recesses are filled with the polysilicon films 23. Subsequently, the silicon substrate 1 and the semiconductor layer 10 are bonded to each other. The resultant structure is as shown in FIG. 13A, in which the BOX layer 2 includes a plurality of polysilicon films 23 isolated from each other.

The configuration of FIG. 13A can be formed with easier steps relative to the configuration of FIG. 9. However, in a directly downward direction with respect to the N$^+$-type region 12, an electric field is generated mostly in the BOX layer 2 in FIG. 9, while in FIG. 13A, an electric field is generated in an area defined below the polysilicon films 23 in the BOX layer 2. This means the configuration of FIG. 9 can more effectively be used for improving a breakdown voltage.

In the second preferred embodiment, the part including the second P-type regions 14, and the insulating oxide films 21 and 22, may also be provided to cover the entirety of the bottom surface of the semiconductor layer 10. Further, a determinant of a potential of each of the plurality of second P-type regions 14 is not limited to a voltage applied from outside. Alternatively, each one of the plurality of second P-type regions 14 may have a potential determined by capacitive coupling therebetween.

Third Preferred Embodiment

Figure 14:
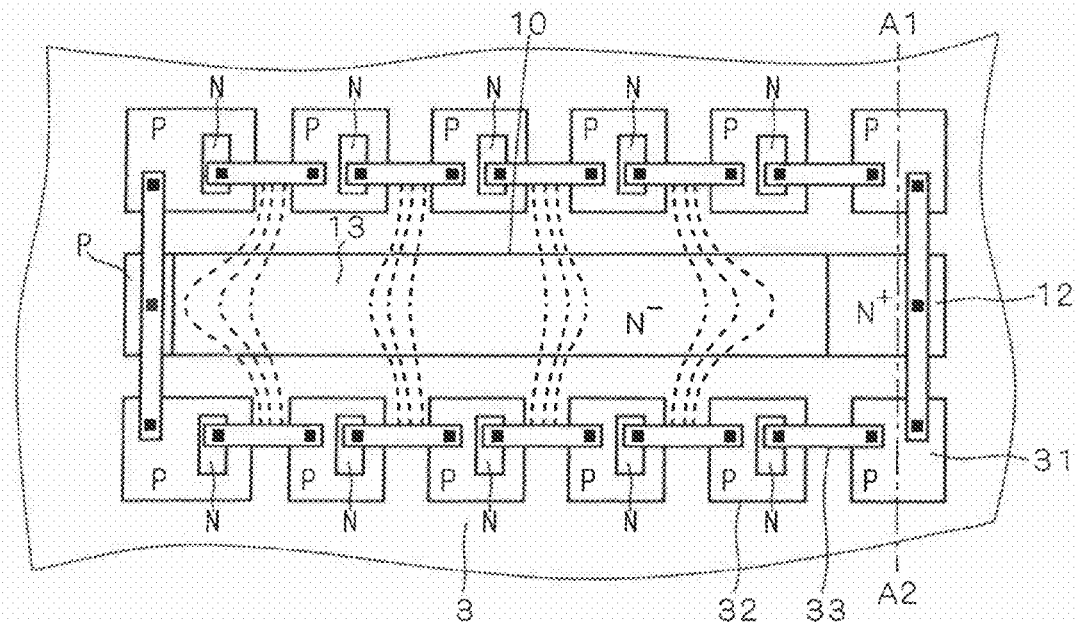
FIGS. 14 and 15 illustrate a configuration of a semiconductor device according to a third preferred embodiment of the present invention.

FIG. 14 is a top view illustrating a configuration of a semiconductor device according to a third preferred embodiment of the present invention. In FIG. 14, the same constituent elements as those shown in FIG. 1 are designated by the same reference numerals. With reference to FIG. 14, the PiN diode including the first P-type region 11, the N$^+$-type region 12, and the N$^-$-type region 13, has a strip-like shape. For simplification, the anode electrode 5 and the cathode electrode 6 are omitted from FIG. 14. The isolation oxide film 3 as a fourth insulating film is provided around the semiconductor layer 10 holding this PiN diode therein, namely, on side surfaces of the semiconductor layer 10. P-type layers 31 and diodes 32 are formed in the isolation oxide film 3. One P-type layer 31 and more than one diode 32 are connected in series through interconnect lines 33 while connecting the first P-type region 11 and the N$^+$-type region 12, whereby a voltage dividing element is formed which divides a voltage across the first P-type region and the N$^+$-type region 12 in a multistep process. For the convenience of description, the diodes 32 constituting the voltage dividing element will be referred to as "voltage dividing diodes 32".

With reference to FIG. 14, the voltage dividing diodes 32 each include an N-type region and a P-type region surrounding the N-type region, and the pn junction therebetween is isolated from the isolation oxide film 3. Each one of the voltage dividing diodes 32 is thus allowed to maintain a voltage which is subjected to no influence of the potential of the isolation oxide film 3. As a result, the voltage dividing element including the plurality of voltage dividing diodes 32 connected to each other is operative to divide a voltage across the first P-type region 11 and the N$^+$-type region 12 in a multistep process.

The voltage dividing elements each including the P-type layer 31 and the voltage dividing diodes 32 are provided along both sides of the PiN diode formed in the semiconductor layer 10. On both sides of the N$^+$-type region 12, the P-type regions 31 are directly connected thereto. Therefore, in a reverse-biased state, the P-type layers 31 on both sides of the N$^+$-type region 12 are approximately the same in potential as the N$^+$-type region 12. The P-type region of the voltage dividing diode 32 will be lower in potential relative to the P-type layer 31, as the voltage dividing diode 32 gets nearer to the first P-type region 11. In FIG. 14, the resultant equipotential lines are indicated by dotted lines.

Figure 15:
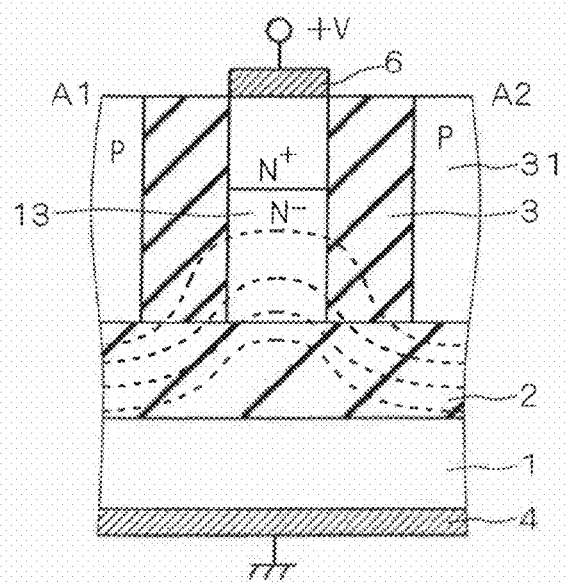

In a reverse-biased state, the electric field between the N$^+$-type region 12 and the silicon substrate 1 will be highest under the N$^+$-type region 12, at the interface between the N$^-$-type region 13 and the BOX layer 2. FIG. 15 is a sectional view taken along a cutting line A1-A2 indicated in FIG. 14. In the third preferred embodiment, the P-type layers 31 on both sides of the N$^+$-type region 12 are approximately the same in potential as the N$^+$-type region 12, whereby the equipotential lines in a reverse-biased state are those indicated by dotted lines of FIG. 15. Electric lines of force are bent toward the P-type layers 31 on both sides of the N$^+$-type region 12, at the interface between the N$^-$-type region 13 and the BOX layer 2 having the highest electric field strength. Electric field concentration is thereby relaxed at this interface. Similar to the first preferred embodiment, improvement in breakdown voltage is also realized in the PiN diode formed in the semiconductor layer 10.

When the third preferred embodiment is intended to obtain a large current by providing a plurality of PiN diodes connected in parallel, the PiN diode and the voltage dividing element may be alternately arranged, and then connected in parallel with each other. One voltage dividing element can thus be shared between two PiN diodes for improving the respective breakdown voltages of the PiN diodes, thereby controlling increase in circuit area.

As long as a voltage across the first P-type region 11 and the N$^+$-type region 12 is sequentially divided in a multistep process, a voltage dividing element may have an alternative structure, and may not be limited to the one shown in FIG. 14. In the example of FIG. 14, the pn junction of each voltage dividing diode 32 is isolated from the isolation oxide film 3. The voltage dividing diodes 32 may be replaced by voltage dividing diodes 32a shown in FIG. 16. The voltage dividing diodes 32a each have such a structure that the pn junction thereof is on a surface contacting the isolation oxide film 3, other than the surface which faces the semiconductor layer 10. Such a configuration also allows each one of the voltage dividing diodes 32a to maintain a voltage which is subjected to no influence of the isolation oxide film 3, still resulting in improvement in breakdown voltage of the PiN diode for the same reason given above.

Alternatively, a voltage dividing element may include a plurality of P-type layers 31 arranged in juxtaposition with the PiN diode, and a plurality of voltage dividing diodes 32b placed away from the semiconductor layer 10. The voltage dividing diodes 32b each include a P-type region bearing a potential that is applied to a corresponding one of the plurality of P-type layers 31 through an interconnect line 34. In a reverse-biased state, the P-type layers 31 on both sides of the N$^+$-type region 12 are thus approximately the same in potential as the N$^+$-type region 12. The P-type layer 31 will be lower in potential relative to the P-type layers 31 on both sides of the N$^+$-type region 12, as the P-type layer 31 gets nearer to the first P-type region 11. That is, the configuration of FIG. 17 provides the same voltage distribution as the one obtained by the configuration shown in FIGS. 14 and 15, still resulting in improvement in breakdown voltage of the PiN diode.

With reference to FIG. 17, the voltage dividing diodes 32b are placed away from the PiN diode, which arrangement allows each one of the voltage dividing diodes 32 to maintain a voltage which is subjected to no influence of the potential of the PiN diode. As no consideration should be given to the influence of the PiN diode, the voltage dividing diodes 32b may have an arbitrary structure. By way of example, P-type regions and N-type regions may be provided in a polysilicon layer in alternate layers to form the voltage dividing diodes 32b connected in series. The voltage dividing diodes 32b thereby formed result in size reduction, suppressing increase in element forming area. The P-type layers 31 may by replaced by N-type layers or polysilicon layers, as long as these alternatives have a conductivity.

Figure 18:
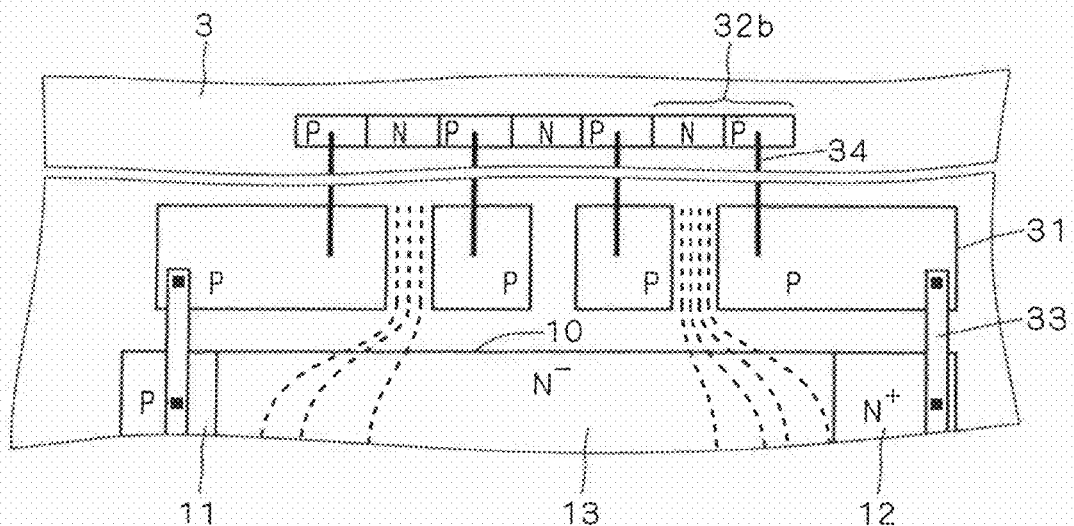

In a diode taking advantage of RESURF effect, an end portion of an anode (pn junction between the first P-type region 11 and the N⁻-type region 13), and an end portion of a cathode (boundary between the N⁺-type region 12 and the N⁻-type region 13), are likely to develop electric field concentration. In response, the P-type layer 31 being the same in potential as the first P-type region 11, and the P-type layer 31 being the same in potential as the N⁺-type region 12, may be elongated in the lengthwise direction of the PiN diode. The P-type layer 31 being the same in potential as the first P-type region 11 should extend at least on the side of the end portion of the anode, and the P-type layer 31 being the same in potential as the N⁺-type region 12 should extend at least on the side of the end portion of the cathode. The resultant equipotential contours are bent accordingly as shown in FIG. 18, allowing electric concentration to be relaxed at the respective end portions of the anode and the cathode. As a result, the breakdown voltage of a PiN diode can be improved to a greater degree.

Fourth Preferred Embodiment

The first preferred embodiment necessitates some complexity in manufacturing steps. As an example, with reference to FIGS. 4 through 6, deposition of a semiconductor layer, oxide deposition, and ion implantation should be performed twice in two stages. If all these stages are performed in one stage, the resultant structure is such that, with reference to FIG. 1, the isolation oxide film 3 and the insulating oxide films 21 reach the same height, and the semiconductor layer 10 and the second P-type regions 14 have the same depth. That is, the second P-type regions 14 and the insulating oxide films 21 reach the upper surface of the semiconductor layer 10. Due to this, when the second P-type regions 14 and the insulating oxide films 21 have their respective patterns as shown in FIG. 2 or FIG. 8, the first P-type region 11 and the N⁺-type region 12 are completely isolated from each other, failing to function as a diode.

Figure 19:
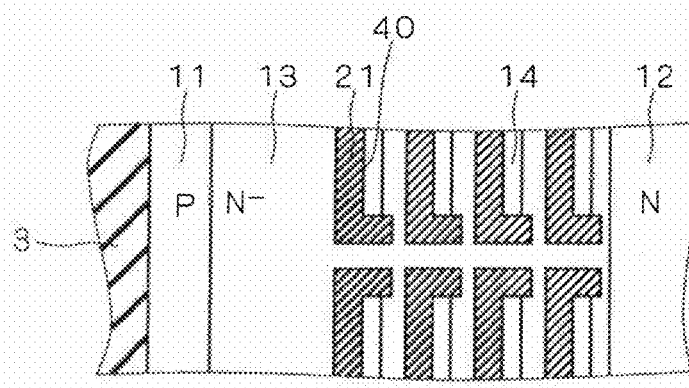
FIG. 19 illustrates a configuration of a semiconductor device according to a fourth preferred embodiment of the present invention.

A fourth preferred embodiment of the present invention is intended to provide a structure of a semiconductor device for preventing this problem. FIG. 19 is a top view illustrating a configuration of a semiconductor device according to the fourth preferred embodiment. In FIG. 19, the same constituent elements as those shown in FIG. 1 are designated by the same reference numerals. Further, the anode electrode 5 and the cathode electrode 6 are omitted. The insulating oxide films 21 as fifth insulating films provided upright on the BOX layer 2 reach the upper surface of the semiconductor layer 10. The insulating oxide films 21 each have a recess 40 defined in the N⁻-type region 13 of the semiconductor layer 10, on the side of the N⁺-type region 12 with respect to the insulating oxide films 21. The second P-type regions 14 as fifth regions are provided in the recesses 40 of the insulating oxide films 21. In other words, the insulating oxide films 21 are closer to the anode (first P-type region 11) than the second P-type regions 14. Although not shown, the recesses 40 and the second P-type regions 14 reach the BOX layer 2. Pairs each including the insulating oxide film 21 and the second P-type region 14 are arranged with a certain distance therebetween, such that the first P-type region 11 and the N⁺-type region 12 are not completely isolated from each other, whereby the semiconductor layer 10 remains operative to function as a diode.

That is, in the example of FIG. 19, a PiN diode is defined in the center of the semiconductor layer 10. The second P-type regions 14 in a floating state are formed on both sides of the PiN diode. The insulating oxide films 21 are provided to the respective P-type regions 14, closer to the anode (first P-type region 11) than the second P-type regions 14.

The second P-type regions 14 contact the N⁻-type region 13 on the side of the cathode. Accordingly, the second P-type region 14 closest to the N⁺-type region 12 bears a potential approximately the same as a cathode potential in a reverse-biased state. The second P-type region 14 will be lower in potential relative to this second P-type region 14 closest to the N⁺-type region 12, as the second P-type region 14 gets nearer to the first P-type region 11. The resultant voltage distribution of this semiconductor device is similar to the one obtained in the semiconductor device of the third preferred embodiment. As a result, according to the same reason as given in the third preferred embodiment, improvement in breakdown voltage of a semiconductor device is also realized.

Due to the existence of the BOX layer 2 and the insulating oxide films 21 on the side electric field directions, electric charges of the second P-type regions 14, while positively charged in a reverse-biased state, cannot move from the second P-type regions 14. As a result, no avalanche phenomenon occurs. Further, the second P-type regions 14 and the insulating oxide films 21 reach the upper surface of the semiconductor layer 10. This allows the second P-type regions 14 and the insulating oxide films 21 to be formed simultaneously with the first P-type region 11 and the isolation oxide film 3 in the same step, respectively, thereby contributing to simplification of manufacturing process.

In the example of FIG. 19, the second P-type regions 14 are shown to be formed in the recesses 40. Alternatively, the second P-type regions 14 may be entirely surrounded by the respective insulating oxide films 21 as shown in FIG. 20. In this case, similar to the second preferred embodiment, application of a predetermined voltage from outside, or capacitive coupling between the second P-type regions 14, is necessary to determine the potential of each one of the second P-type regions 14.

In the examples of FIGS. 19 and 20, the pairs each including the second P-type region 14 and the insulating oxide film 21 are linearly arranged in such a way that a PiN diode is defined in the center of the semiconductor layer 10, with the pairs of the second P-type region 14 and the insulating oxide film 21 on both sides. The second P-type regions 14 and the insulating oxide films 21 may alternatively be arranged in a nonlinear way between the first P-type region 11 and the N⁺-type region 12, an example of which is shown in FIG. 21. With reference to FIG. 21, the pairs of the second P-type region 14 and the insulating oxide film 21 are displaced relative to the lengthwise direction of the PiN diode, whereby the first P-type region 11 and the N⁺-type region 12 are not linearly connected through the N⁻-type region 13. Accordingly, linear travel of carriers is limited to a short distance. An avalanche phenomenon is caused by positive feedback by electrons and holes. For this reason, as the distance of linear travel of carriers becomes shorter (down to 1 μm or less), an avalanche phenomenon will be less likely, resulting in improvement in breakdown voltage to a greater degree.

Fifth Preferred Embodiment

Figure 22:
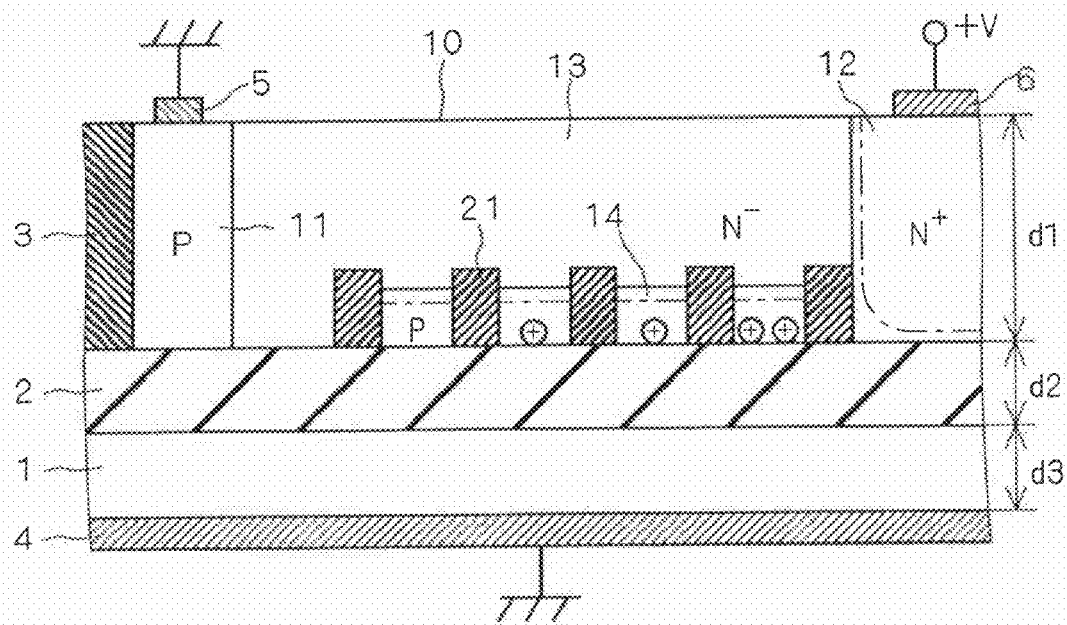
FIG. 22 illustrates a configuration of a semiconductor device according to a fifth preferred embodiment of the present invention.

FIG. 22 is a sectional view illustrating a configuration of a semiconductor device according to a fifth preferred embodiment of the present invention. In FIG. 22, the same constituent elements as those shown in FIG. 1 are designated by the same reference numerals. The semiconductor device of the fifth preferred embodiment differs from the semiconductor device of the first preferred embodiment in that the N$^+$-type region 12 extends as far as to the bottom surface of the semiconductor layer 10, namely, as far as to the BOX layer 2.

Figure 23:
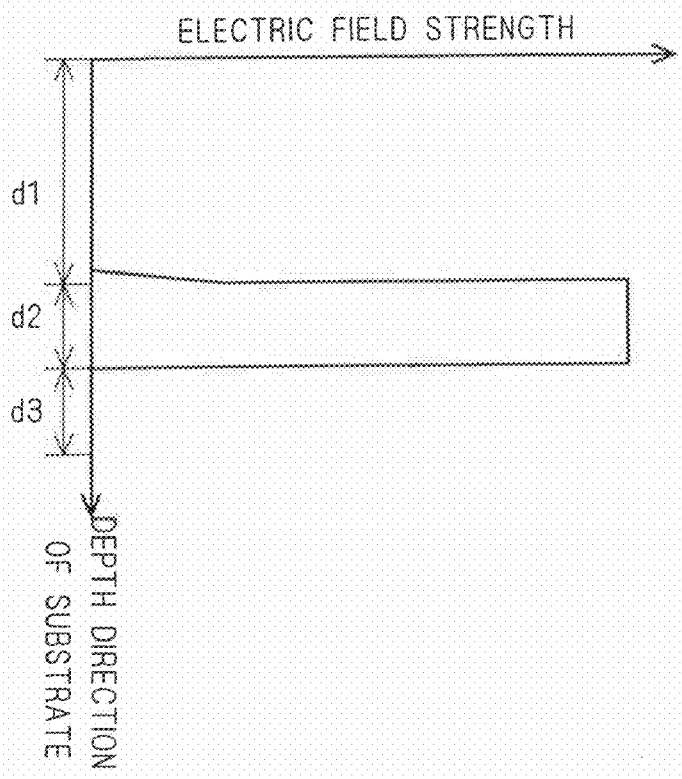
FIG. 23 shows an electric field distribution in a directly downward direction with respect to a cathode of the semiconductor device according to the fifth preferred embodiment of the present invention.

FIG. 23 shows an electric field distribution in a directly downward direction with respect to the N$^+$-type region 12 in a reverse-biased state. Reference characters d1 through d3 of FIG. 23 correspond to those indicated in FIG. 22. As seen form FIG. 23, in a downward direction with respect to the N$^+$-type region 12, nearly all the electric field is generated in the BOX layer 2. The second P-type regions 14 are operative in the same manner as in the first preferred embodiment, to control electric field concentration at the interface between the BOX layer 2 and the semiconductor layer 10. As a result, the resultant electric field distribution between the anode and the cathode can be similar to the distribution obtained by a one-dimensional diode structure. In the first preferred embodiment, electric field concentration is likely at a corner of a bottom part of the N$^+$-type region 12 (in FIG. 1, the lower-left corner of the N$^+$-type region 12), which is considered as one of the obstructions to improvement in breakdown voltage. On the other hand, the fifth preferred embodiment causes no such electric field concentration. As a result, the degree of improvement in breakdown voltage can be greater as compared with the first preferred embodiment.

The fifth preferred embodiment characteristically extending the N$^+$-type region 12 as far as to the bottom surface of the semiconductor layer 10 has been described with reference to the first preferred embodiment. However, the applicability of the fifth preferred embodiment is not limited to this. The N$^+$-type region 12 extending as far as to the bottom surface of the semiconductor layer 10 is applicable as well to the second through fourth preferred embodiments, which also results in improvement in breakdown voltage.

Sixth Preferred Embodiment

FIG. 24 is a sectional view illustrating a configuration of a semiconductor device according to a sixth preferred embodiment of the present invention. In FIG. 24, the same constituent elements as those shown in FIG. 1 are designated by the same reference numerals. In contrast to the first preferred embodiment, the second P-type regions 14 are not formed between the insulating oxide films 21. That is, the insulating oxide films 21 are operative to serve as sixth insulating films standing upright on the BOX layer 2 to divide the bottom surface of the semiconductor layer 10. A third P-type region 41 as a sixth region is provided in the semiconductor layer 10 to be connected to the cathode electrode 6.

When a diode of this configuration is brought to a reverse-biased state, and a depletion layer generated in the semiconductor layer 10 reaches the third P-type region 41, holes are supplied from the third P-type region 41 to the bottom surface of the semiconductor layer 10, promptly forming a P-type inversion layer 42. After formation of the P-type inversion layer 42, the depletion layer reaching the third P-type region 41 shrinks, stopping the flow of a hole current.

FIG. 25 shows an electric field distribution at this stage in a directly downward direction with respect to the N$^+$-type region 12. Reference characters d1 through d4 of FIG. 25 correspond to those indicated in FIG. 24. As seen from FIG. 25, in the space between the N$^+$-type region 12 and the silicon substrate 1, an electric field is generated mostly in the BOX layer 2. That is, the P-type inversion layer 42 can be operative in the same manner as the second P-type regions 14 of the first preferred embodiment, producing the effect of improvement in breakdown voltage of a semiconductor device.

As described, the mechanism for forming the P-type inversion layer 42 does not depend on an avalanche phenomenon. Therefore, an initial leakage current is suppressed in the formation of the P-type inversion layer 42. Further, as the formation of the P-type inversion layer 42 necessitates a relatively low potential, a transient response characteristic to voltage application can be enhanced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor substrate;
   a first insulating film provided on said semiconductor substrate;
   a first semiconductor layer provided on said first insulating film, said first semiconductor layer including a first region of a first conductivity type, a second region of a second conductivity type having a relatively low resistance, and a third region of said second conductivity type having a relatively high resistance, said third region being defined between said first region and said second region;
   a fourth insulating film provided on a side surface of said first semiconductor layer; and
   a voltage dividing element connected between said first region and said second region provided along said first semiconductor layer while holding said fourth insulating film therebetween, said voltage dividing element comprising a plurality of series connected diodes dividing a voltage potential across said first region and said second region in a direction from said first region toward said second region in a multistep process such that said potential becomes closer to a potential of said second region as said potential comes nearer to said second region.

* * * * *

UNITED STATES PATENT AND TRADEMARK OFFICE
CERTIFICATE OF CORRECTION

PATENT NO. : 7,855,427 B2
APPLICATION NO. : 12/177707
DATED : December 21, 2010
INVENTOR(S) : Tomohide Terashima It is certified that error appears in the above-identified patent and that said Letters Patent is hereby corrected as shown below:

On the title page, Item (73), the Assignee information is incorrect. Item (73) should read:

-- (73) Assignee: Mitsubishi Denki Kabushiki Kaisha, Tokyo (JP) --

Signed and Sealed this
Eighth Day of March, 2011

David J. Kappos
*Director of the United States Patent and Trademark Office*